United States Patent
Lee (10) Patent No.: US 7,263,021 B2
(45) Date of Patent: Aug. 28, 2007

(54) REFRESH CIRCUIT FOR USE IN SEMICONDUCTOR MEMORY DEVICE AND OPERATION METHOD THEREOF

(75) Inventor: Ihl-Ho Lee, Ichon-shi (KR)

(73) Assignee: Hynix Semiconductor inc. (KR)

( * ) Notice: Subject to any disclaimer, the term of this patent is extended or adjusted under 35 U.S.C. 154(b) by 79 days.

(21) Appl. No.: 11/318,527

(22) Filed: Dec. 28, 2005

(65) Prior Publication Data

US 2006/0221744 A1    Oct. 5, 2006

(30) Foreign Application Priority Data

Mar. 31, 2005   (KR)  ............. 10-2005-0027353

(51) Int. Cl.
*G11C 7/00*    (2006.01)

(52) U.S. Cl. ............... 365/222; 365/230.03

(58) Field of Classification Search ........... 365/222, 365/230.03, 236

See application file for complete search history.

(56) References Cited

U.S. PATENT DOCUMENTS

| 5,966,725 A  * | 10/1999 | Tabo ............. 365/222 |
| 6,400,631 B1 * | 6/2002 | Williams et al. ...... 365/222 |
| 7,088,633 B2 * | 8/2006 | Remaklus et al. ....... 365/222 |
| 2001/0007538 A1* | 7/2001 | Leung ............. 365/222 |
| 2005/0068826 A1 | 3/2005 | Hoehler |
| 2005/0108460 A1 | 5/2005 | David |

FOREIGN PATENT DOCUMENTS

| JP | 10-247384 A | 9/1998 |
| JP | 2003-16782 A | 1/2003 |

* cited by examiner

*Primary Examiner*—Anh Phung
(74) *Attorney, Agent, or Firm*—McDermott Will & Emery LLP (57) ABSTRACT

A refresh circuit for individually performing a refresh operation to a plurality of banks included in a semiconductor memory device, includes: a perbank counter for generating a refresh bank address according to a refresh pulse signal and a perbank command; a perbank multiplexer for selectively outputting one of the refresh bank address and a data access bank address in response to the perbank command; and an internal command state machine for generating a refresh command in response to the refresh pulse signal and the perbank command.

12 Claims, 7 Drawing Sheets

REFRESH CIRCUIT FOR USE IN SEMICONDUCTOR MEMORY DEVICE AND OPERATION METHOD THEREOF

FIELD OF INVENTION

The present invention relates to a refresh circuit for use in a semiconductor memory device; and, more particularly, to a refresh circuit for individually performing a refresh operation to banks included in a semiconductor memory device.

DESCRIPTION OF PRIOR ART

Since a dynamic random access memory (DRAM) is a volatile memory device, the DRAM requires a refresh operation in order to hold a data stored in a memory cell. In case of a synchronous DRAM (SDRAM), a plurality of banks are included in the SDRAM and each bank includes memory cells in a matrix form corresponding to a row address and a column address. If each of four banks has 8K numbers of row addresses, four row addresses are activated for a single refresh operation. Accordingly, when 8K numbers of refresh operations are performed, the refresh operation is completed, i.e., all the memory cells are refreshed.

However, as the SDRAM is highly integrated, the number of memory cells connected to a single row address is increased and, thus, a power consumption for the refresh operation is increased.

Meanwhile, recently, for reducing a load due to the refresh operation, a piled refresh is performed. For instance, if 8 banks are included in a semiconductor memory device, four bank are firstly refreshed and, then, the other four banks are refreshed. That is, bank 0 to bank 3 are firstly activated and, then, bank 4 to bank 7 are activated after a lapse of a row to row activated delay (tRRD). However, in this case, a refresh cycle time (tRFC) is increased since the tRRD is added to the tRFC.

SUMMARY OF INVENTION

It is, therefore, an object of the present invention to provide a refresh circuit for reducing a peak current required for a refresh operation without increasing a refresh cycle time.

In accordance with an aspect of the present invention, there is provided a refresh circuit for individually performing a refresh operation to a plurality of banks included in a semiconductor memory device, including: a perbank counter for generating a refresh bank address according to a refresh pulse signal and a perpank command; a perbank multiplexer for selectively outputting one of the refresh bank address and a data access bank address in response to the perbank command; and an internal command state machine for generating a refresh command in response to the refresh pulse signal and the perbank command.

In accordance with another aspect of the present invention, there is provided a refresh method for performing a refresh operation to a selected bank among a plurality of banks included in a semiconductor memory device, including the steps of: generating a refresh bank address according to a refresh pulse signal and a perpank command; selectively outputting one of the refresh bank address and a data access bank address in response to the perbank command; and generating a refresh command in response to the refresh pulse signal and the perbank command.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a refresh circuit in accordance with the present invention will be described in detail referring to the accompanying drawings.

Figure 1:
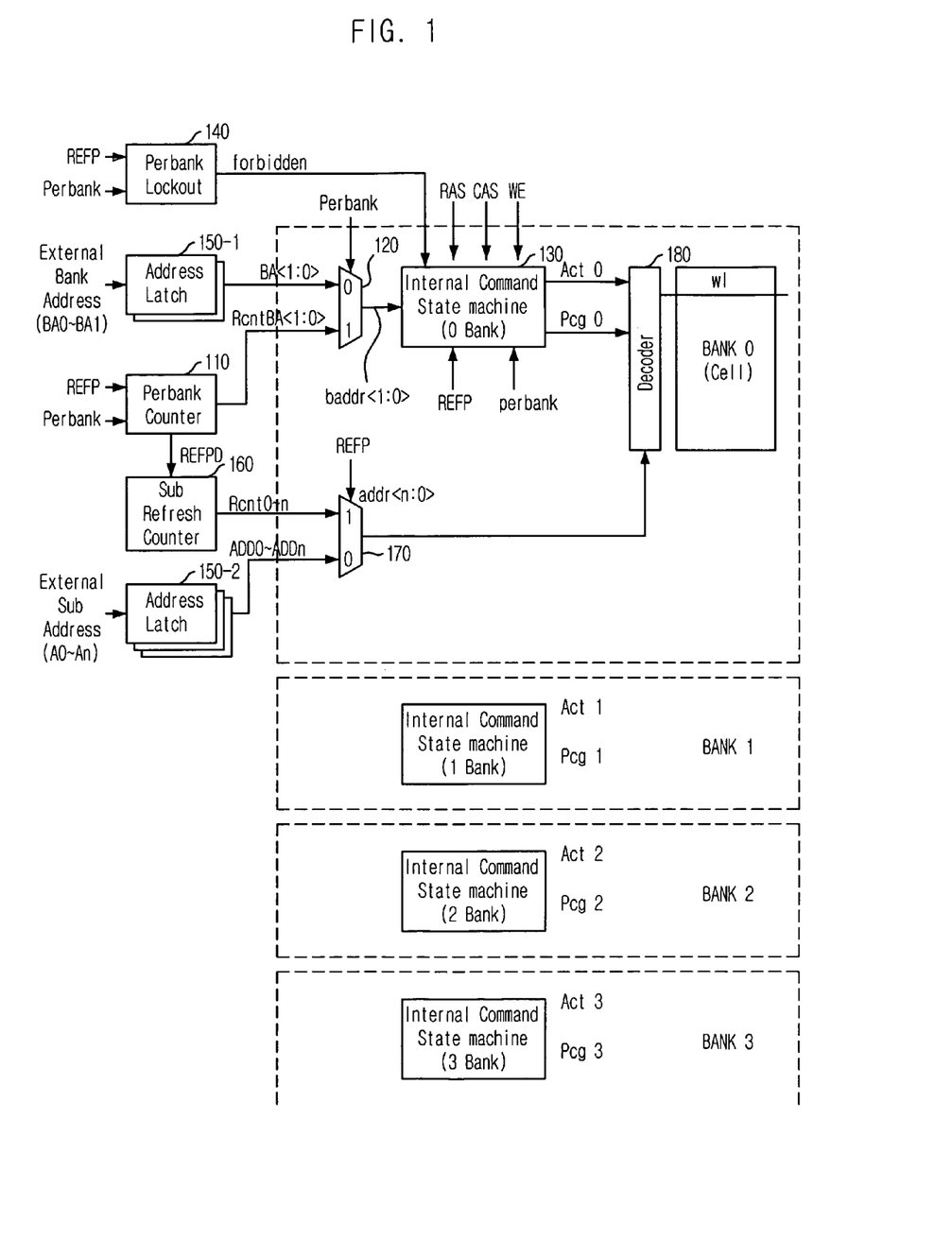
FIG. 1 is a block diagram showing a refresh circuit for individually refreshing banks included in a semiconductor memory device in accordance with a preferred embodiment of the present invention.

FIG. 1 is a block diagram showing a refresh circuit for individually refreshing banks included in a semiconductor memory device in accordance with a preferred embodiment of the present invention.

As shown, the refresh circuit includes a perbank counter 110, a perbank multiplexer 120, an internal command state machine 130 and a perbank lockout unit 140. Herein, it is assumed that the semiconductor memory device includes four banks.

At a normal operation mode, when an external address signal including an external bank address signal BA<0:1> and an external sub address signal A<0:n> is inputted, the perbank multiplexer 120 passes the external bank address signal BA<0:1> in response to a perbank command Perbank and a sub multiplexer 170 passes the external sub address signal A<0:n> in response to the perbank command Perbank.

A decoder 180 decodes the external bank address signal BA<0:1> and the external sub address signal A<0:n> passed by the perbank multiplexer 120 and the sub multiplexer 170 respectively in order to activate corresponding address of all the banks. Herein, for instance, the perbank command Perbank may be inputted from a mode register set circuit, or the perbank command Perbank can be directly inputted from a control circuit employed for controlling the semiconductor memory device.

Meanwhile, when a refresh pulse signal REFP and the perbank command Perbank are inputted to the perbank counter 110, the perbank counter 110 outputs an internal address signal. Herein, the internal address signal includes an internal bank address signal RcntBA<0:1> and an internal sub address signal Rcnt<0:n>. That is, the perbank counter 110 outputs a first and a second bank address signals RcntBA0 and RcntBA1 to the perbank multiplexer 120 and outputs the refresh pulse signal REFP to a sub refresh counter 160.

Therefore, the perbank multiplexer 120 selects only one of the four banks according to a combination of a first bank address signal RcntBA0 and a second bank address signal RcntBA1. Also, the sub refresh counter 160 sequentially outputs the internal sub address signal Rcnt<0:n> and the sub multiplexer 170 selectively outputs the internal sub address signal Rcnt<0:n> according to the refresh pulse signal REFP. The internal command state machine 130 generates an active signal Act or a precharge signal Pcg according to external commands, i.e., a row address strobe (RAS) signal, a column address strobe (CAS) signal and a write enable (WE) signal.

Each addresses, which is enabled as the sequentially inputted internal sub address signal Rcnt<0:n> is decoded, is activated or precharged according to the active signal Act and the precharge signal Pcg.

Herein, according to a first embodiment of the present invention, by setting the first and the second bank address signals RcntBA0 and RcntBA1 as the uppermost bit and the secondly uppermost bit respectively, the banks can be refreshed as shown in the following sequence: address 0 of bank 0->address 1 of bank 0-> . . . ->address n of bank 0->address 0 of bank 1->address 1 of bank 1-> . . . and so on.

Figure 2:
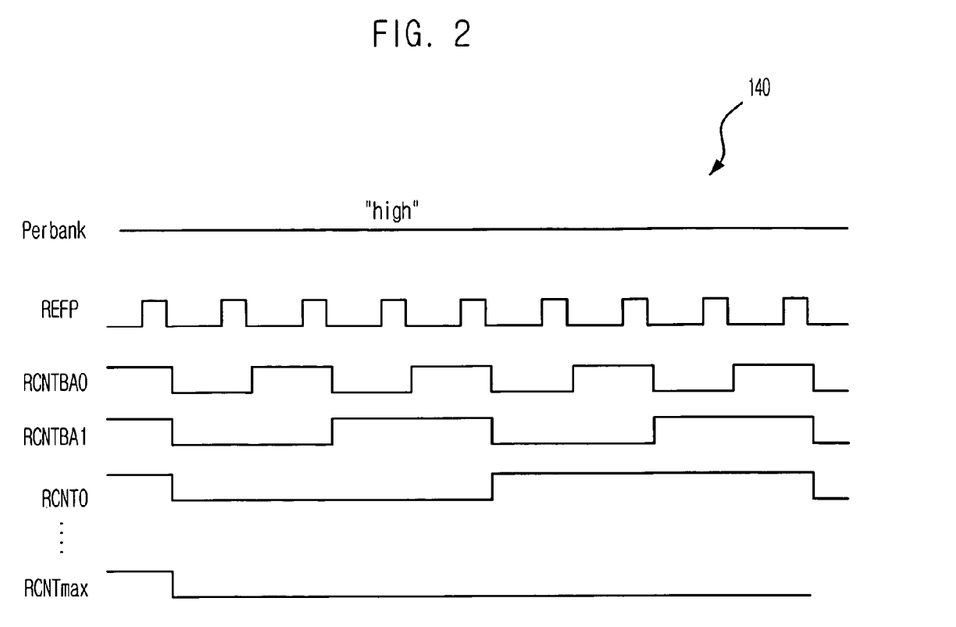
FIG. 2 is an operational timing diagram of a counter.

According to another embodiment of the present invention, by setting the first and the second bank address signals RcntBA0 and RcntBA1 as the downmost bit and the secondly downmost bit respectively, the banks can be refreshed as shown in the following sequence: address 0 of bank 0->address 0 of bank 1->address 0 of bank 2->address 0 of bank 3->address 1 of bank 0->address 1 of bank 1-> . . . and so on (refer to an operational timing diagram of a counter shown in FIG. 2).

Figure 3:
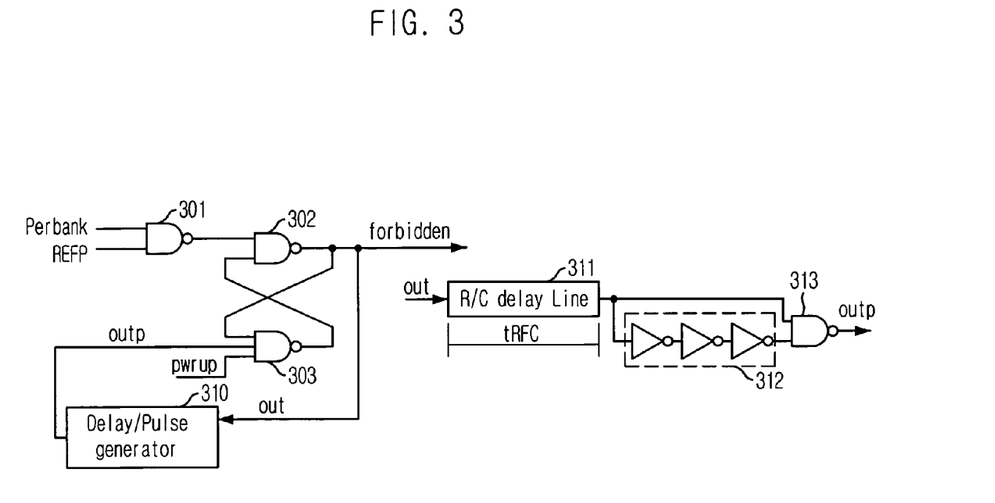
FIG. 3 is a schematic circuit diagram showing the perbank lockout unit shown in FIG. 1.
Figure 4:
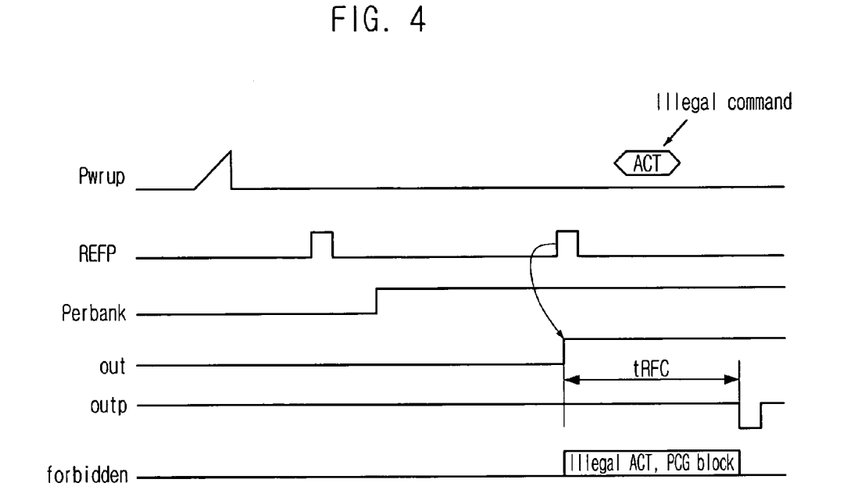
FIG. 4 is a timing diagram showing an operation of the perbank lockout unit shown in FIG. 3.

FIG. 3 is a schematic circuit diagram showing the perbank lockout unit 140 shown in FIG. 1, and FIG. 4 is a timing diagram showing an operation of the perbank lockout unit 140.

The perbank lockout unit 140 serves to prevent another operation from being performed when a refresh operation is performed according to the external address signal or the internal address signal. For instance, even though another command is generated when the refresh operation is performed by activating an address 0, the perbank lockout unit 140 intercepts the command so that the refresh operation can be stably performed. That is, a forbiddance signal (forbidden) is enabled when the refresh pulse signal REFP is inputted. The forbiddance signal (forbidden) is disabled after a lapse of a refresh cycle time.

Figure 5:
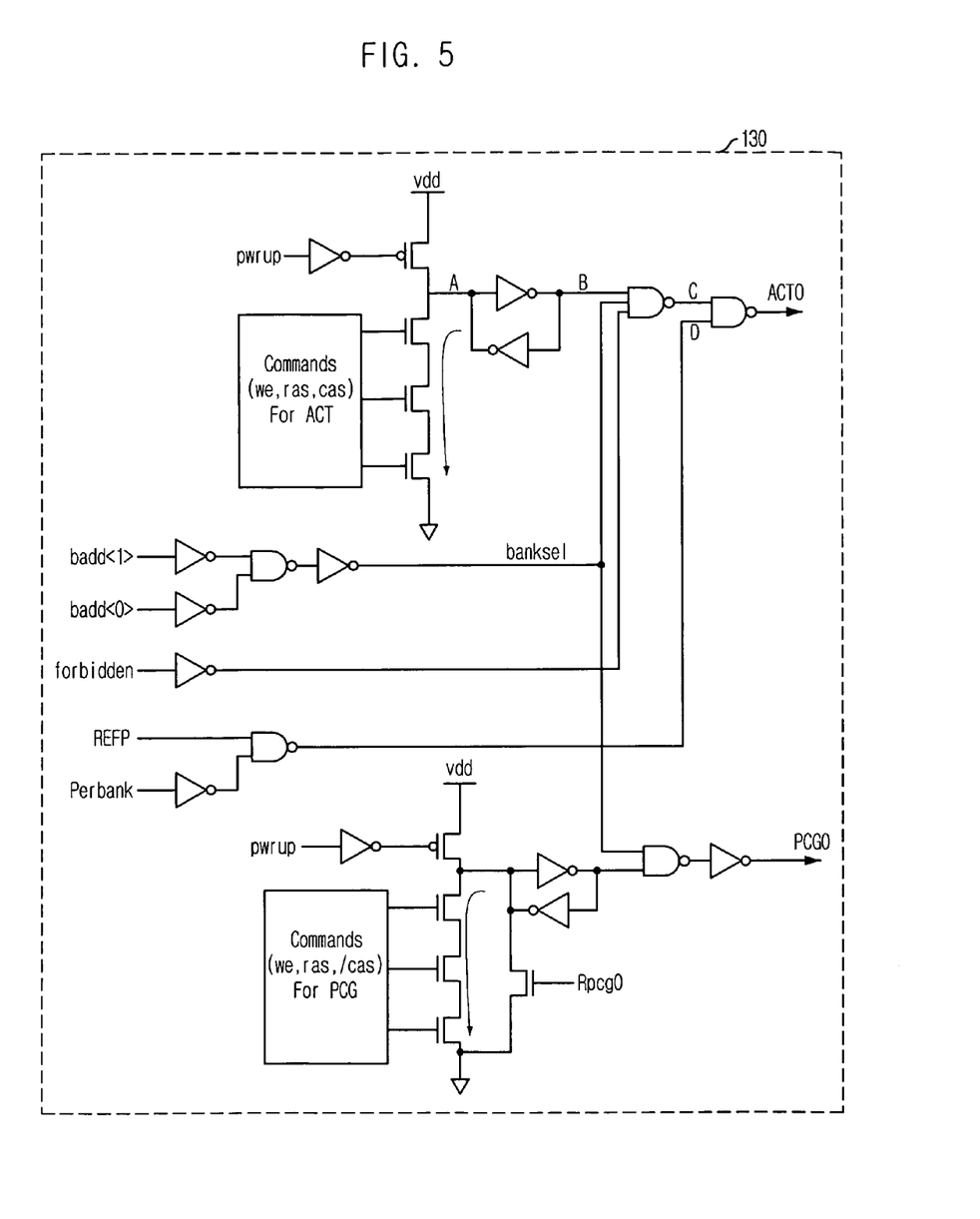
FIG. 5 is a schematic circuit diagram showing the internal command state machine shown in FIG. 1.

FIG. 5 is a schematic circuit diagram showing the internal command state machine 130 shown in FIG. 1.

At a perbank operation, in response to a power-up signal pwrup, bank address signals badd<0> and badd<1> generated by the perbank multiplexer 120, the forbiddance signal generated by the perbank lockout unit 140, the refresh pulse signal REFP, the perbank signal Perbank, commands for an active operation and commands for a precharge operation, the internal command state machine 130 outputs an active command signal and a precharge command signal to only a bank which is selected according to a bank address signal.

A node A has a logic high level in response to the power-up signal pwrup and the node A has a logic low level in response to the commands for an active operation. Herein, a refresh precharge signal Rpcg0 is a pulse signal activated after a predetermined delay time tRAS is passed since an activation of an active command signal. The predetermined delay time tRAS is a required delay time for activating a row address strobe signal. Therefore, if an active command signal ACT0 is activated, a precharge command signal PCG0 is activated after the predetermined delay time.

Figure 6A:
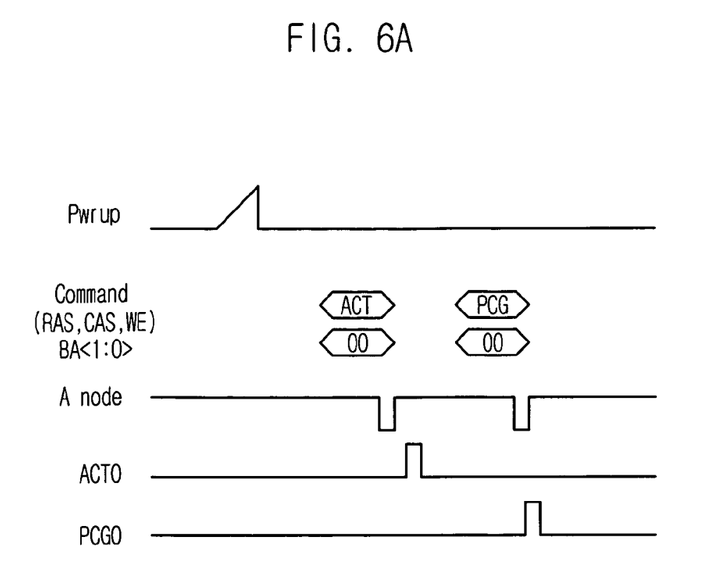
FIGS. 6A to 6C are operational timing diagrams according to an operation mode.
Figure 6B:
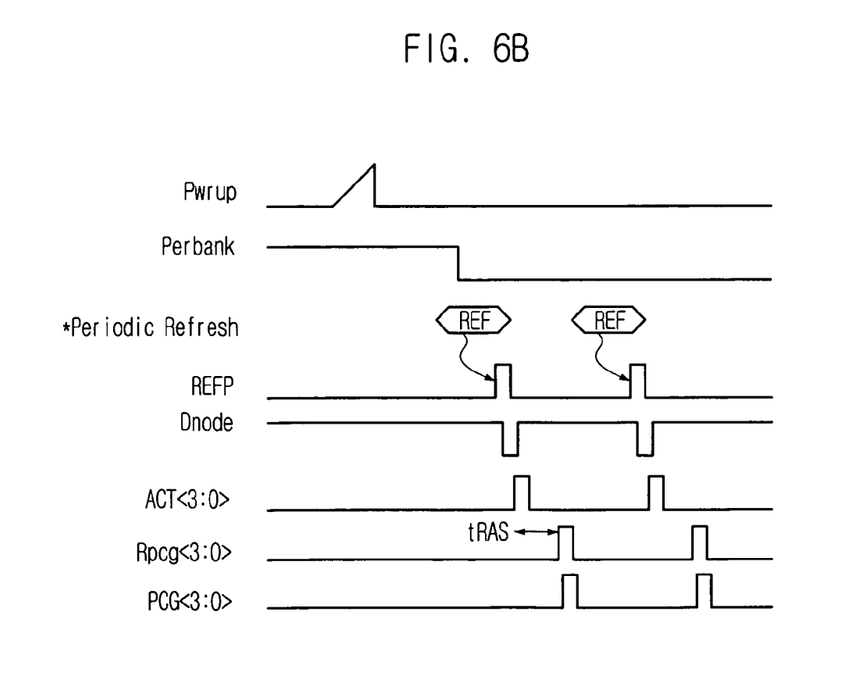
Figure 6C:
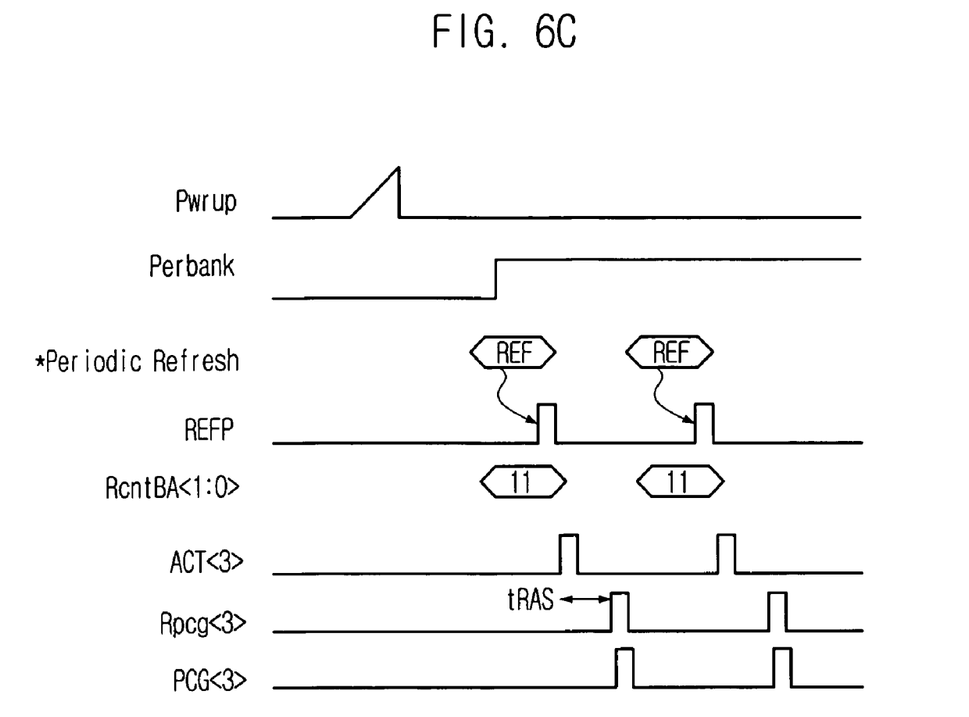

FIGS. 6A to 6C are operational timing diagrams according to an operation mode.

FIG. 6A is a timing diagram at a normal mode. As shown, a predetermined bank is precharged after the predetermined bank is activated.

FIG. 6B is a timing diagram at a refresh mode according to the prior art. As shown, the active operation and the precharge operation are performed to all the banks.

FIG. 6C is a timing diagram at a refresh mode according to the present invention. As shown, the active operation and the precharge operation are performed to a single bank.

Therefore, in accordance with the present invention, a peak current required for the refresh operation can be reduced without increasing a refresh cycle time.

The present application contains subject matter related to Korean patent application No. 2005-27353, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A refresh circuit for individually performing a refresh operation to each of a plurality of banks included in a semiconductor memory device, comprising:
   a perbank counter for generating a refresh bank address according to a refresh pulse signal and a perbank command;
   a perbank multiplexer for selectively outputting one of the refresh bank address and a data access bank address in response to the perbank command; and
   an internal command state machine for generating a refresh command in response to the refresh pulse signal and the perbank command.

2. The refresh circuit as recited in claim 1, wherein the data access bank address is inputted from external of the semiconductor memory device.

3. The refresh circuit as recited in claim 2, wherein the refresh command includes an active signal and a precharge signal.

4. The refresh circuit as recited in claim 3, further comprising a perbank lockout unit for generating a forbiddance signal in order to prevent another command from being performed when the refresh command is performed.

5. The refresh circuit as recited in claim 4, wherein the perbank counter sets one of a plurality of the refresh bank addresses as the uppermost bit signal.

6. The refresh circuit as recited in claim 4, wherein the perbank counter sets one of a plurality of the refresh bank addresses as the downmost bit.

7. The refresh circuit as recited in claim 4, wherein the perbank lockout unit includes:
   a first NAND gate for receiving the refresh pulse signal and the perbank command;
   a second NAND gate for receiving an output of the first NAND gate;
   a pulse generator for generating a pulse signal by delaying an output of the second NAND gate; and
   a third NAND gate for receiving the output of the second NAND gate, a power-up signal and an output of the pulse generator, wherein an output of the third NAND gate is inputted to the second NAND gate.

8. A refresh method for performing a refresh operation to a selected bank among a plurality of banks included in a semiconductor memory device, comprising the steps of:
   generating a refresh bank address according to a refresh pulse signal and a perbank command;
   selectively outputting one of the refresh bank address and a data access bank address in response to the perbank command; and generating a refresh command in response to the refresh pulse signal and the perbank command.

9. The refresh method as recited in claim 8, wherein the step of generating the refresh command includes a step of outputting one of an active signal and a precharge signal according to the refresh command.

10. The refresh method as recited in claim 9, further comprising the step of:

generating a forbiddance signal according to the refresh pulse signal and the perbank command in order to prevent another command from being performed when the refresh command is performed.

11. The refresh method as recited in claim 10, wherein the step of generating the refresh bank address includes a step of setting one of a plurality of the refresh bank addresses as the uppermost bit signal.

12. The refresh method as recited in claim 10, wherein the step of generating the refresh bank address includes a step of setting one of a plurality of the refresh bank addresses as the downmost bit signal.

* * * * *